United States Patent
Huang

(10) Patent No.: US 11,671,107 B2
(45) Date of Patent: Jun. 6, 2023

(54) ANALOG-TO-DIGITAL CONVERTER AND METHOD THEREOF

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 1 day.

(21) Appl. No.: 17/388,756

(22) Filed: Jul. 29, 2021

(65) Prior Publication Data

US 2022/0337261 A1     Oct. 20, 2022

(30) Foreign Application Priority Data

Apr. 15, 2021  (TW) ................... 110113631

(51) Int. Cl.
*H03M 1/10*  (2006.01)
*H03M 1/46*  (2006.01)

(52) U.S. Cl.
CPC .......... *H03M 1/1023* (2013.01); *H03M 1/466* (2013.01)

(58) Field of Classification Search
CPC .. H03M 1/1023; H03M 1/1033; H03M 1/442; H03M 1/462; H03M 1/466; H03M 1/468
USPC ........................................ 341/120, 163, 172
See application file for complete search history.

(56) References Cited

U.S. PATENT DOCUMENTS 8,947,290 B2 * 2/2015 Miki ................... H03M 1/1061
                                                                341/172
9,467,159 B1 * 10/2016 Tai ....................... H03M 1/1057
9,553,599 B1 * 1/2017 Chen ................... H03M 1/1033
10,090,851 B2 * 10/2018 Hiraide ............... H03M 1/1061
2018/0183455 A1    6/2018 Lee et al.

OTHER PUBLICATIONS

Muchit Kozak, Mustafa Karaman, Izzet Kale, Efficient architectures for time-interleaved oversampling delta-sigma converters, IEEE Transactions on Circuits and Systems-II: Analog and Digital Signal Oricessing, vol. 47, No. 8, Aug. 2000.
Chun-Cheng Liu, Soon-Jyh Chang, Guan-Ying Huang, Ting-Zu Lin, A10-bit 50-MS/s SAR ADC with a monotonic capacitor switching procedure, IEEE Journal of Solid-State Circuits, vol. 45, No. 4, Apr. 2010.

* cited by examiner

*Primary Examiner* — Khai M Nguyen
(74) *Attorney, Agent, or Firm* — WPAT, P.C. Intellectual Property Attorneys; Anthony King

(57) ABSTRACT

An analog-to-digital converter, configured to convert an input signal into an n bits digital output signal, includes a capacitor module, a control signal generation unit, a comparator, and a register. The capacitor module is configured to receive the input signal at a sampling phase in a normal mode, and to generate a first sampling signal and a second sampling signal according to the input signal in a conversion phase. The control signal generation unit is configured to adjust the first sampling signal or the second sampling signal in the conversion phase. In the normal mode, the comparator is configured to compare the first sampling signal and the second sampling signal in the conversion phase to generate n comparison signals. The register is configured to store the n comparison signals as the digital output signal, and output the digital output signal in the normal mode.

18 Claims, 4 Drawing Sheets

ANALOG-TO-DIGITAL CONVERTER AND METHOD THEREOF

CROSS-REFERENCE TO RELATED APPLICATIONS

This application claims the benefit of priority to patent application Ser. No. 11/0,113,631, filed in Taiwan on Apr. 15, 2021, which is incorporated by reference in its entirety.

TECHNICAL FIELD

The present application relates to an analog-to-digital converter and conversion method, in particular, to a successive-approximation register analog-to-digital converter and conversion method.

BACKGROUND

In the successive-approximation register analog-to-digital conversion operation, the signal undergoes sampling, comparison, and internal sub-digital-to-analog conversion steps in order to generate and output the final digital signal. However, during this process, the signal may be mixed with different types of noise, such as quantization noise and thermal noise, due to the imperfections of the device itself. These noises reduce the signal-to-noise and distortion ratio (SNDR) of the signal after digital-to-analog conversion, which in turn reduces the quality of the final digital signal. Therefore, how to reduce signal noise has become one of the critical issues in this field.

SUMMARY OF THE INVENTION

Some embodiments of the present disclosure provide an analog-to-digital converter configured to convert an input signal into a first digital output signal having n bits. The analog-to-digital converter includes a first capacitor module, a first control signal generation unit, a first comparator, and a first register. The first capacitor module is configured to receive a first input signal at a sampling phase in a normal mode, and to generate a first sampling signal and a second sampling signal according to the first input signal in a conversion phase. The first control signal generation unit is configured to adjust the first sampling signal or the second sampling signal in the conversion phase. The first comparator is coupled to the first capacitor module. In the normal mode, the first comparator is configured to compare the first sampling signal and the second sampling signal in the conversion phase to generate n first comparison signals. The first register is configured to store the first comparison signals as the first digital output signal, and output the first digital output signal in the normal mode.

Some embodiments of the present disclosure provide an analog-to-digital conversion method configured to convert an input signal into a first digital output signal having n hits. The method includes the steps of: receiving a first input signal in a sampling phase of a normal mode; generating a first sampling signal and a second sampling signal according to the first input signal in a conversion phase of the normal mode; comparing the first sampling signal and the second sampling signal to generate n first comparison signals in the conversion phase of the normal mode; and storing the first comparison signals as the first digital output signal, and outputting the first digital output signal in the normal mode. The step of generating the first sampling signal and the second sampling signal according to the first input signal in the conversion phase of the normal mode includes: adjusting the first sampling signal or the second sampling signal.

Compared with the prior art, the analog-to-digital converter and method of the present application calculate the average value of the signal to obtain the signal's partial DC offset and adjust the common-mode voltage of the input signal of the comparator according to the partial DC offset, so as to change the residual value, thereby increasing the SNDR of the output signal.

DETAILED DESCRIPTION

Figure 1:
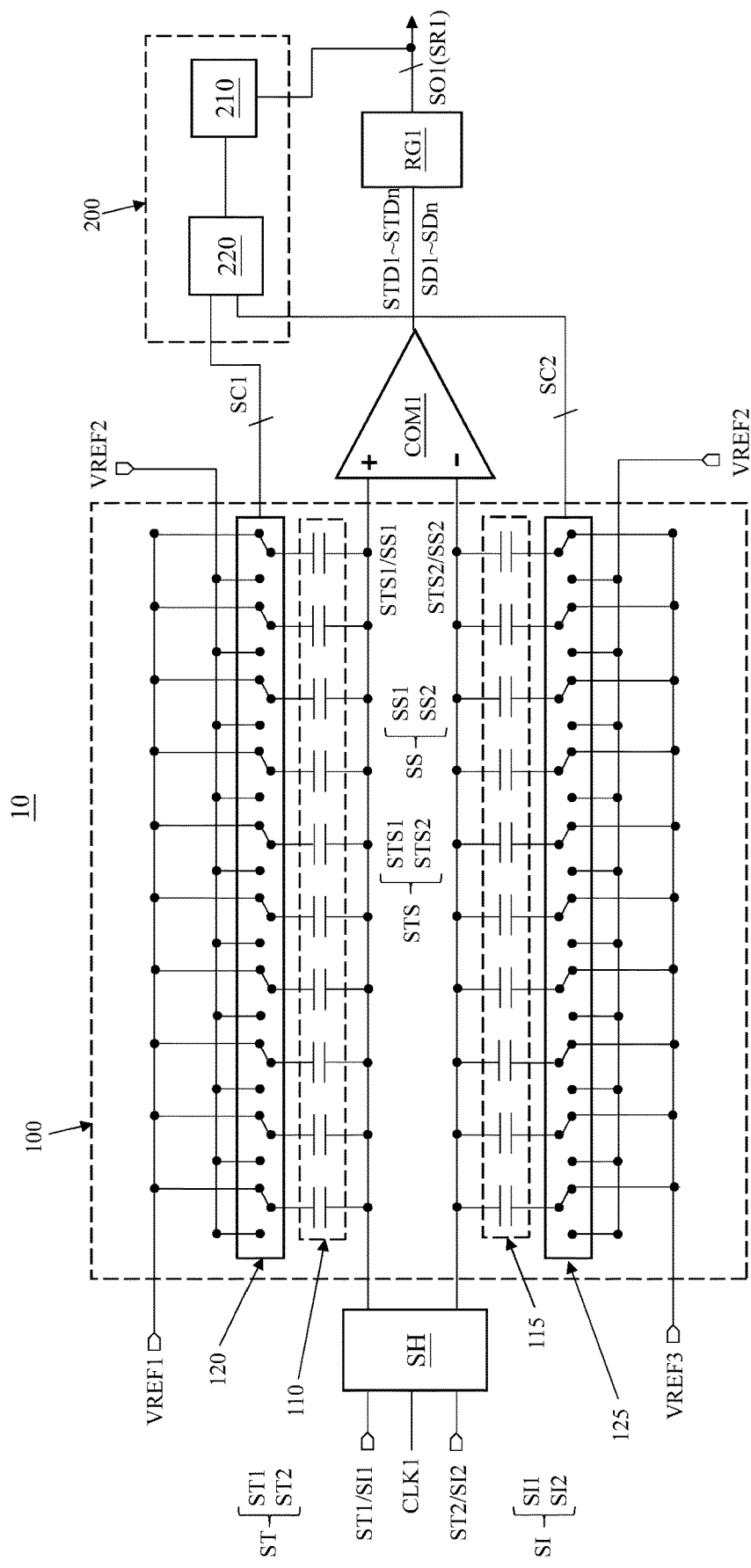
FIG. 1 is a schematic diagram illustrating an analog-to-digital converter according to some embodiments of the present disclosure.

FIG. 1 is a schematic diagram illustrating an analog-to-digital converter (ADC) 10 according to some embodiments of the present disclosure. The ADC 10 is configured to sample an input signal SI to perform analog-to-digital conversion and output a digital output signal SO1 having n bits accordingly.

In the embodiment of FIG. 1, the ADC 10 is a successive-approximation register analog-to-digital converter (SAR ADC) and includes a sample-and-hold circuit SH, a capacitor module 100, a comparator COM1, a register RG1, and a control signal generation unit 200.

The operation of the ADC 10 includes a sampling phase and a conversion phase that are alternating. The sample-and-hold circuit SH samples the input signal SI to generate a sampling signal SS in the sampling phase. In this case, the input signal SI is a differential signal, including a positive input signal SI1 and a negative input signal SI2 (hereinafter, signal SI1 and signal SI2). Correspondingly, the sampling signal SS includes a positive sampling signal SS1 and a negative sampling signal SS2 (hereinafter, signal SS1 and signal SS2). In the conversion phase, the sample-and-hold circuit SH stops sampling the input signal SI; the capacitor module 100 transmits the signal SS1 and the signal SS2 to the comparator COM1 for n comparison operations to sequentially generate n comparison signals SD1~SDn. The register RG1 is configured to stores the n comparison signals SD1~SDn; during each comparison operation, the current comparison signals SD1~SDn are outputted as a digital output signal SO1 having n bits, wherein the comparison signal SDx represents the value of the $x^{th}$ bit of the digital output signal SO1 having n bits. After the completion of the n comparison operations, the register RG1 is reset. In this case, during each comparison operation performed by the comparator COM1, the control signal generation unit 200 is configured to generate a control signal SC1 according to the current digital output signal SO1 and transmit the same to the capacitor module 100, so that before each comparison operation, the capacitor module 100 can adjust the magnitudes of the signal SS1 and/or the signal SS2 according to control signal SC1 and then proceed with the next comparison operation.

As shown in FIG. 1, the control signal generation unit 200 includes a calculation circuit 210 and an adjustment circuit 220. In some embodiments, the calculation circuit 210 is configured to calculate the digital value represented by the $n^{th}$ bit in the digital output signal SO1 according to the $n^{th}$ comparison operation; the adjustment circuit 220 is configured to generate the control signal SC1 according to the digital value. For the capacitor module 100, one digital value corresponds to a configuration of the capacitor module 100, and the adjustment circuit 220 generates the control signal SC1 according to the digital value represented by the $n^{th}$ bit in the digital output signal SO1, so that the capacitor module 100 is switched to the configuration according to the control signal SC1. When the capacitor module operates in different configurations, it can provide different adjustments to the signal SS1 and the signal SS2.

During the analog-to-digital conversion, because the resolution of the digitalized signal is limited, there is a quantization error between the outputted digital signal and the inputted analog signal. Further, the quantization noise is also introduced in the analog-to-digital conversion process and is reflected in the digital output signal. Thus, a difference between the digital signal obtained and the analog signal is referred to as the "residual value." The residual value includes quantization noise and quantization error, thereby resulting in the distortion of the digital signal, consequently reducing the SNDR of the digital signal. In certain embodiments, the quantization noise of the digital output signal SO1 includes the DC offset of the signal SS1 and the signal SS2, the DC offset of the comparator COM1, and the noise resulted from the charge injection effects of the capacitor module 100. In this case, the cause of the DC offset of the signal SS1 and the signal SS2 may come from the poor matching between the circuits of the positive terminal and the negative terminal in the capacitor module 100 that are coupled to the comparator COM1, which results in a common-mode voltage between the signal SS1 and the signal SS2 being not equal to 0. In other words, the DC offset of the ADC 10 includes the common-mode voltage between the signal SS1 and the signal SS2.

To reduce the distortion of the digital output signal SO, the present disclosure provides embodiments that are capable of generating the control signal SC1 to control the capacitor module 100 so that during the analog-to-digital conversion, the residual value resulted from the DC offset to the digital output signal SO1 can be effective decreased in real-time. In other words, the present application can decrease the residual value resulted from the DC offset to the digital output signal SO1 before it transmits the residual value of the digital output signal SO1. In this way, the operation range of the ADC 10 and the SNDR of the ADC 10 can be increased. In brief, the operation of the ADC 10 includes a calibration mode and a normal mode. The operation of the normal mode corresponds to the operation in which the general ADC converts an input signal into a digital output signal. According to the present application, before the normal mode, the ADC 10 enters the calibration mode to estimate the DC offset mentioned above, and then in the subsequent normal mode, it reduces the estimated DC offset in real-time. See below for detailed discussions.

The sample-and-hold circuit SH samples the offset test signal ST in a sampling phase of the calibration mode. The offset test signal ST is a differential signal pair, including a positive offset test signal ST1 and a negative offset test signal ST2 (hereinafter, the signal ST1 and the signal ST2). The signal ST1 and the signal ST2 are predetermined and configured to measure the DC offset of the signal SS1 and the signal SS2 and the DC offset of the comparator COM1. In the present embodiment, the common-mode voltage between the signal ST1 and the signal ST2 is 0. Specifically, both the signal ST1 and the signal ST2 can be set as 0 to simplify the operation. The signal ST1 and the signal ST2 are sampled to generate a positive offset test sampling signal STS1 and a negative offset test sampling signal STS2 (hereinafter, the signal STS1 and the signal STS2). In the calibration mode, the comparator COM1 performs n comparison operations on the signal STS1 and signal STS2 in a conversion phase to sequentially generate n offset comparison signals STD1~STDn. The register RG1 outputs the n offset comparison signals STD1~STDn as the digital output signal SO1 having n bits. Because both the signal ST1 and the signal ST2 are set to 0, in theory, the digital value of the digital output signal SO1 at this point is 0. However, in some embodiments, because of the DC offset resulting from the capacitor module 100 and the comparator COM1, the digital output signal SO1 in the calibration mode may not equal to 0. Consequently, in the calibration mode, the value of the digital output signal SO1 at least includes the DC offset resulted from the capacitor module 100 and the DC offset resulted from the comparator COM1. To facilitate the discussion, the digital output signal SO1 generated using the signal ST1 and the signal ST2 having a common-mode voltage of 0 in the calibration mode is referred to as an offset reference signal SR1.

After obtaining the offset reference signal SR1, the control signal generation unit 200 is configured to calculate an offset value of the offset reference signal SR1, generate the control signal SC1 and control signal SC2 accordingly, and transmit the same to the capacitor module 100. The calculation circuit 210 calculates the offset value of the offset reference signal SR1. For example, when the theoretical value of the offset reference signal SR1 should be 0 (because both the signal ST1 and the signal ST2 are 0), the obtained value of the offset reference signal SR1 is the offset value resulted from other components (such as the capacitor module 100 and the comparator COM1) on the offset reference signal SR1. In some embodiments, the calculation circuit 210 is further configured to store the offset value of the offset reference signal SR1 obtained in the calibration mode. In the normal mode, when performing each comparison operation, the calculation circuit 210 adds the digital value calculated according to the digital output signal SO1 with the offset value so that the adjustment circuit 220 can generate the control signal SC1 and the control signal SC2 according to the offset value, which are used to adjust the signal SS1 and the signal SS2 in the conversion phase. More specifically, when performing the $n^{th}$ comparison operation in the normal mode, the calculation circuit 210 adds the digital value of the $n^{th}$ bit of the digital output signal SO1 with the offset value of the offset reference signal SR1 obtained in the calibration mode; the adjustment circuit 220 generates the control signal SC1 and the control signal SC2 according to the summation result, and the capacitor module 100 adjusts the magnitudes of the signal SS1 and the signal SS2 according to the control signal SC1 and the control signal SC2 for the comparison operation of the next bit. Because at this point, the capacitor module 100's configuration corresponding to the control signal SC1 and control signal SC2 includes the digital value of the $n^{th}$ bit of the digital output signal SO1 and the offset value of offset reference signal SR1 obtained in the calibration mode, the capacitor module 100 can not only adjust the signal SS1 and the signal SS2 for the general SAR ADC operation but also reduce the absolute value of the common-mode voltage between the signal SS1 and the signal SS2 before the signal SS1 and the signal SS2 are transmitted to the comparator COM1. In this way, the comparator COM1 can perform the comparison operation according to the signal SS1 and the signal SS2 with less DC offset.

The capacitor module 100 includes a positive terminal capacitor array 110, a negative terminal capacitor array 115, a switching device 120, and a switching device 125. The positive terminal capacitor array 110 and the switching device 120 are configured to process the signal STS1 and the signal SS1, and the negative terminal capacitor array 115 and the switching device 125 are configured to process the signal STS2 and the signal SS2. Because the signals are differential pairs, only the operations performed on the positive terminal are discussed in detail below, and some operations performed on the negative terminal are omitted.

The positive terminal capacitor array 110 includes a plurality of capacitors connected in parallel, wherein the design of the capacitance of the plurality of capacitors can be implemented according to the design of a general SAR ADC, and the present disclosure does not particular limit its implementation. For example, the capacitance values of the plurality of capacitors increase by a fixed ratio. For example, the capacitance of the next capacitor is twice the capacitance of the previous capacitor. Therefore, when different capacitors are switched from the reference voltage VREF1 to the reference voltage VREF2, the amount of change of the signal SS1 is also different. Each of the plurality of capacitors includes a first terminal (also referred to as a top plate) and a second terminal (also referred to as a bottom plate). The first terminals of the plurality of capacitors are coupled to the sample-and-hold circuit SH and the comparator COM1, and the second terminals of the plurality of capacitors are each selectively electrically connected to the reference voltage VREF1 or the reference voltage VREF2 therein through the switch device 120, wherein the reference voltage VREF1 is greater than the reference voltage VREF2. In some embodiments, the reference voltage VREF2 is the system ground. The switch device 120 switches the second terminal of the positive terminal capacitor array 110 to the reference voltage VREF1 or the reference voltage VREF2 according to the control signal SC1 to adjust the magnitude of the signal SS1.

In the normal mode, in addition to generating the control signal SC1 according to the digital output signal SO1 in the conversion phase, the control signal generation unit 200 can further generate the control signal SC1 according to the offset value of the offset reference signal SR1 obtained in the calibration mode. The switching device 120 receives the control signal SC1 and adjusts the magnitude of the signal SS1, and reduces the absolute value of the common-mode voltage between the signal SS1 and the signal SS2 according to the control signal SC1 before each time that the comparator COM1 performs the comparison operation. After reducing the absolute value of the common-mode voltage between the signal SS and the signal SS2; that is, after decreasing the noise of the signal SS1 and the signal SS2, the SNDR of the signal SS1 and the signal SS2 is increased, thereby increasing the SNDR of the digital output signal SO1. In some embodiments, when the capacitor module 100 reduces the absolute value of the common-mode voltage between the signal SS1 and the signal SS2, only one of the signal SS1 and the signal SS2 is adjusted to reach the effect of adjusting the common-mode voltage substantially. In some embodiments, the capacitor module 100 only reduces a fraction of the absolute value of the common-mode voltage between the signal SS1 and the signal SS2; for example, the SNDR of the signal SS1 and the signal SS2 is effectively increased by merely reducing the absolute value of the common-mode voltage between the signal SS1 and the signal SS2 to half of the original value. In some other embodiments, the capacitor module 100 cancels the common-mode voltage between the signal SS1 and the signal SS2 according to the control signal SC1.

Similarly, the negative terminal capacitor array 115 includes a first terminal and a second terminal. The first terminal is coupled to the sample-and-hold circuit SH and the comparator COM1, and the second terminal is selectively electrically connected to the reference voltage VREF3 or the reference voltage VREF2 therein through the switch device 120, wherein the reference voltage VREF2 is greater than the reference voltage VREF3. In some embodiments, the reference voltage VREF2 is equal to a common-mode voltage of the reference voltage VREF1 and the reference voltage VREF3. The switching device 125 switches the second terminal of the negative terminal capacitor array 115 to the reference voltage VREF3 or the reference voltage VREF2 according to the control signal SC2 to adjust the magnitude of the signal SS2. The arrangement of the negative terminal capacitor array 115 is symmetrical to that of the positive terminal capacitor array 110 and is omitted herein for the sake of brevity.

Figure 2:
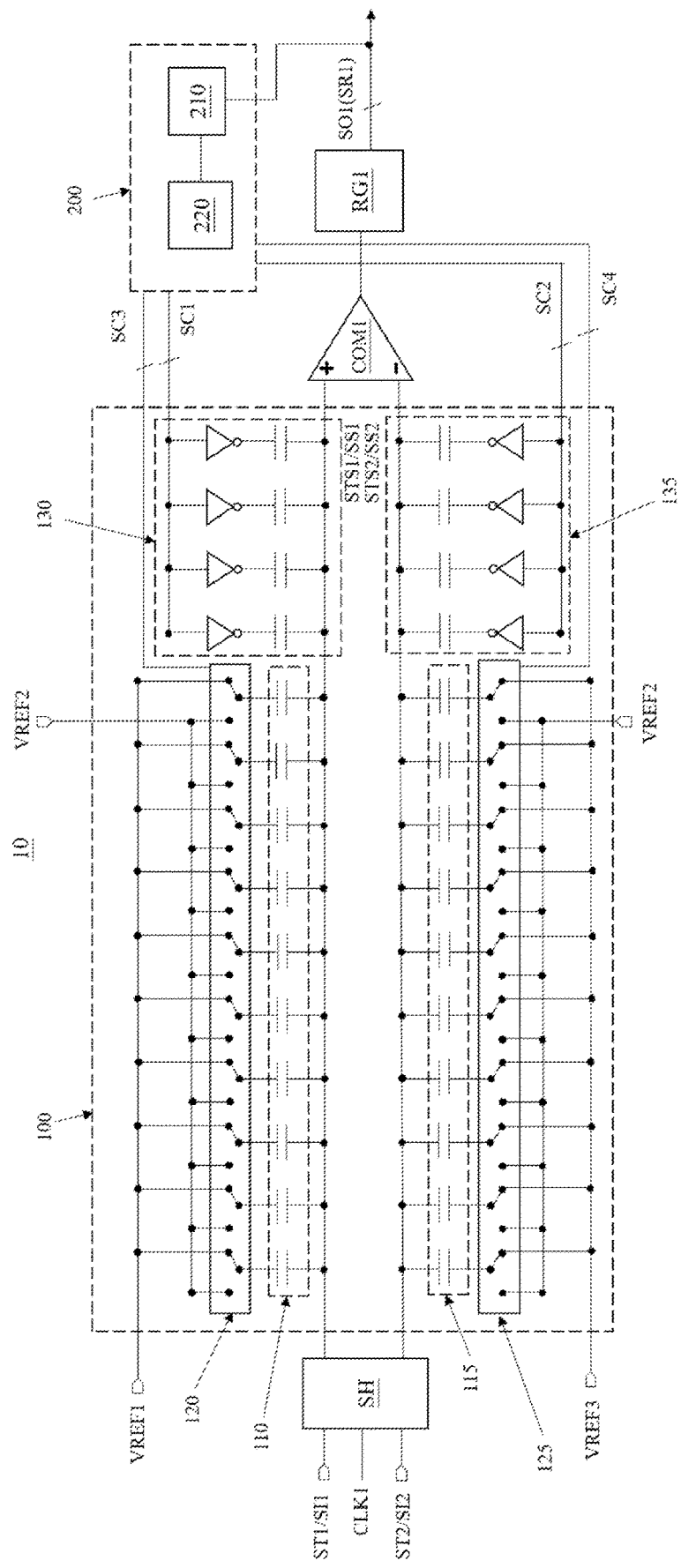
FIG. 2 is a schematic diagram illustrating an analog-to-digital converter according to some other embodiments of the present disclosure.

In the embodiment of FIG. 1, the control signal SC1 is configured to adjust the magnitude of the signal SS1 so as to reduce the absolute value of the common-mode voltage between the signal SS1 and the signal SS2. However, the present disclosure is not limited thereto. In some other embodiments, the ADC 10 can generate a control signal SC3 (as shown in FIG. 2) different from the control signal SC1 to reduce the absolute value of the common-mode voltage between the signal SS1 and the signal SS2 and adjust the magnitude of the signal SS1, respectively, and generate control signal SC4 (as shown in FIG. 2) different from the control signal SC2 to reduce the absolute value of the common-mode voltage between the signal SS1 and the signal SS2 and adjust the magnitude of the signal SS2. Reference is made to FIG. 2. FIG. 2 is a schematic diagram illustrating the ADC 10 according to some other embodiments of the present application. Compared with FIG. 1, the capacitor module 100 further includes a DC offset adjustment circuit 130 and a DC offset adjustment circuit 135, and the control signal generation unit 200 further generates the control signal SC3 and the control signal SC4.

In the embodiment of FIG. 2, the control signal generation unit 200 generates the control signal SC1 and the control signal SC2 according to the offset reference signal SR1 obtained in the calibration mode and generates the control signal SC3 and the control signal SC4 according to the digital output signal SO1 obtained in the normal mode. The control signal SC1 and the control signal SC2 are configured to adjust the common-mode voltage between the signal SS1 and the signal SS2. The control signal SC3 and the control signal SC4 are configured to adjust the signal SS1 and the signal SS2, respectively, before the comparator COM1 performs each comparison operation.

In the normal mode, the control signal generation unit 200 transmits the control signal SC1 to the DC offset adjustment circuit 130 in the conversion phase. In some embodiments, the control signal SC1 does not change after it has been generated; that is, during the whole normal mode, the control signal SC1 is considered a constant value. In other words, during the whole normal mode, the common-mode voltage between the signal SS1 and the signal SS2 is adjusted to the same value. Further, the control signal generation unit 200 transmits the control signal SC3 to the switch module 120 so that the switch module 120 adjusts the magnitude of the signal SS1 according to the control signal SC3 before each comparison operation.

The DC offset adjustment circuit 130 includes a plurality of capacitors and a plurality of inverters; however, the present disclosure is not limited thereto. A first terminal of each capacitor is coupled to the first terminal of the positive terminal capacitor array 110, and a second terminal of each capacitor is respectively coupled to the control signal SC1 through an inverter. In other words, the control signal SC1 is configured to control the bias of the plurality of capacitors of the DC offset adjustment circuit 130 to adjust the signal SS1. The arrangement of the DC offset adjustment circuit 135 is symmetrical to that of the DC offset adjustment circuit 130 and is omitted herein for the sake of brevity.

Figure 3:
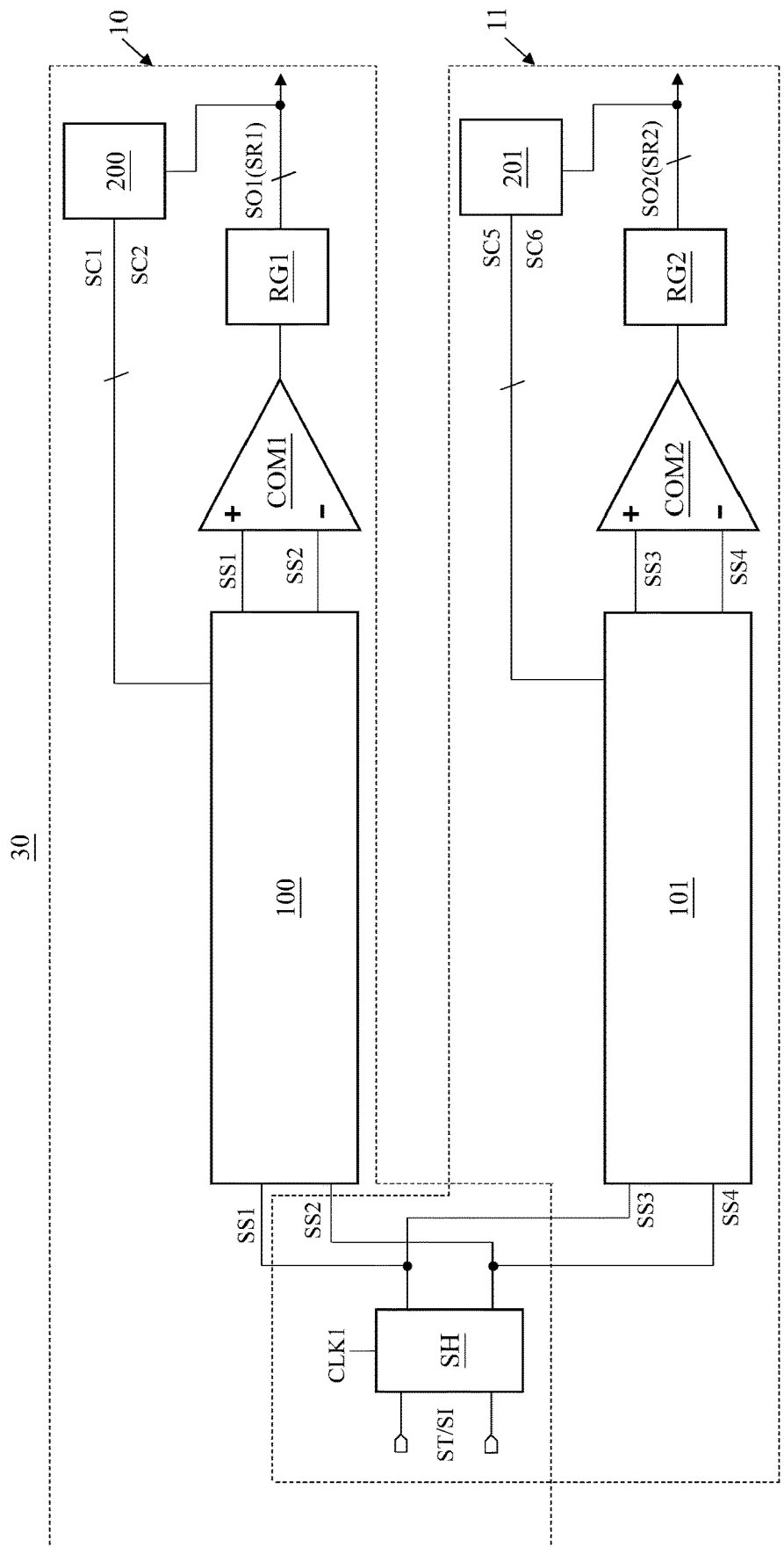
FIG. 3 is a schematic diagram illustrating an analog-to-digital converter according to some embodiments of the present disclosure.

Reference is made to FIG. 3. FIG. 3 is a schematic diagram illustrating an ADC 30 according to some embodiments of the present application. The ADC 30 is a time-interleaved (TI) SAR ADC. The ADC 30 includes the ADC 10 and ADC 11, wherein the ADC 10 and ADC 11 have the same structure and operations.

The ADC 10 and the ADC 11 share the sample-and-hold circuit SH, and the ADC 11 further includes a capacitor module 101, a comparator COM2, a register RG2, and a control signal generation circuit 201.

In the calibration mode, the ADC 10 and the ADC 11 sample the offset test signal ST and then obtain the offset reference signal SR1 corresponding to the ADC 10 and an offset reference signal SR2 corresponding to the ADC 11 (i.e., the digital output signal SO2 obtained in the calibration mode). Next, the control signals SC1, SC2 and control signals SC5, SC6 are respectively generated according to the offset reference signal SR1 and the offset reference signal SR2.

In normal mode, the ADC 10 and the ADC 11 sample the input signal SI alternately to respectively generate the signals SS1, SS2 and the signals SS3, SS4. Next, the ADC 10 and ADC 11 generate the digital output signal SO1 and digital output signal SO2 alternately.

In some embodiments, the ADC 10 included in the ADC 30 may have the structure of the ADC 10 shown in FIG. 1 or the structure of the ADC 10 shown in FIG. 2. The ADC 11 included in the ADC 30 may have the structure of the ADC 10 shown in FIG. 1 or the structure of the ADC 10 shown in FIG. 2.

Figure 4:
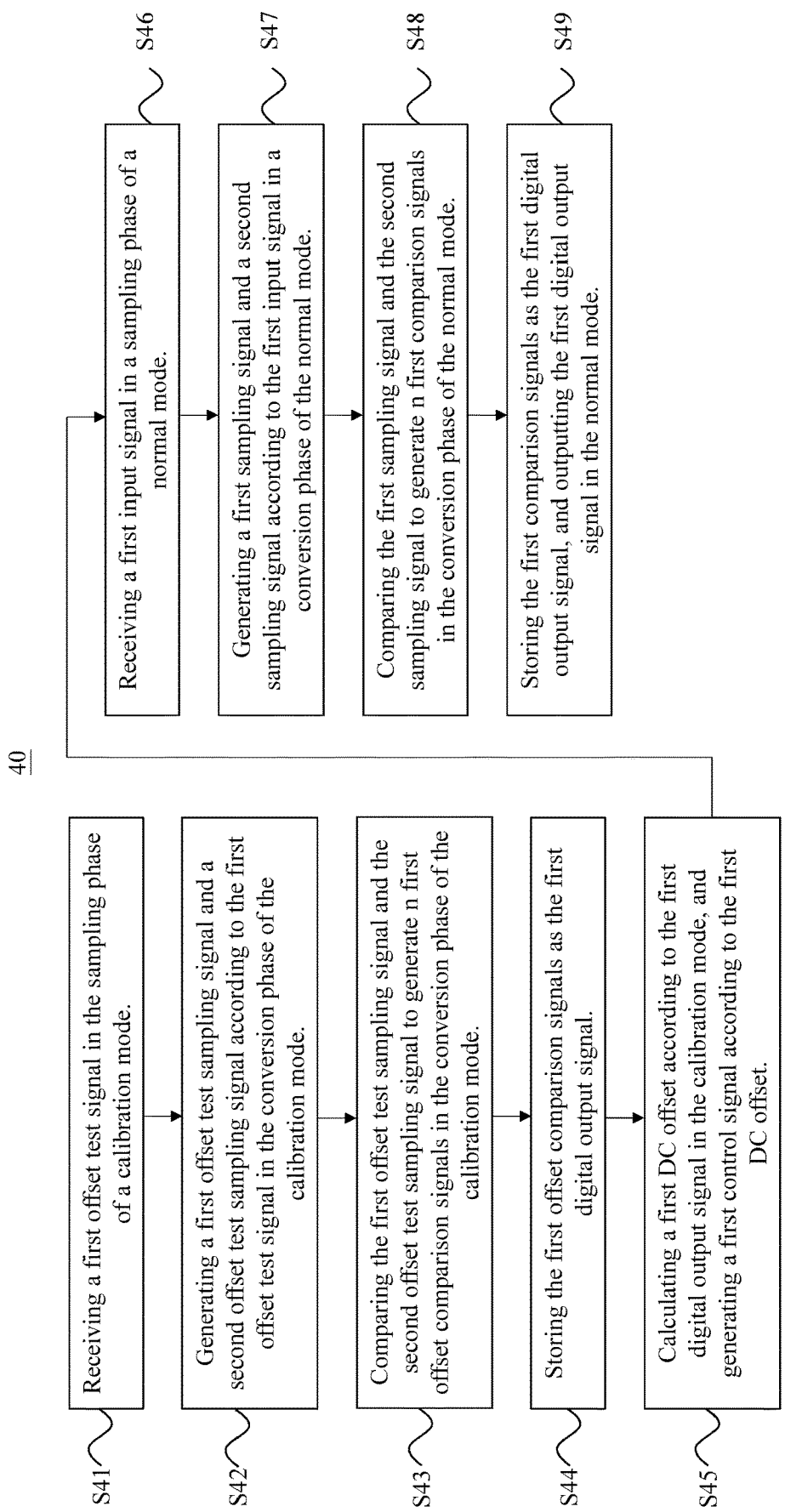
FIG. 4 is a flow chart illustrating an analog-to-digital conversion method according to some embodiments of the present disclosure.

Reference is made to FIG. 4. FIG. 4 is a flow chart illustrating the process steps of an analog-to-digital conversion method 40 according to some embodiments of the present disclosure. In some embodiments, the ADC 10 shown in FIG. 1 or FIG. 2 may use the analog-to-digital conversion method 40 to generate the digital output signal SO1. More specifically, the ADC 10 uses the analog-to-digital conversion method 40 to adjust the signals SS1, SS2 so as to reduce the DC offset of the ADC 10, thereby increasing the SNDR of the digital output signal SO1. The analog-to-digital conversion method 40 includes Steps S41, S42, S43, S44, S45, S46, S47, S48, and S49. To facilitate understanding, the following discussion of the analog-to-digital conversion method 40 uses the reference numerals shown in FIG. 1. Further, the analog-to-digital conversion method 40 is not limited to Steps S41~S49. In further embodiments, the analog-to-digital conversion method 40 also includes the steps associated with the operation of the ADC10 and the ADC 30 shown in FIG. 1 to FIG. 3.

In Step S41, the offset test signal ST is received in a sampling phase of the calibration mode. In Step S42, the signal STS1 and the signal STS2 are generated according to the offset test signal ST in the conversion phase of the calibration mode. In Step S43, the signal STS1 and the signal STS2 are compared to generate n offset comparison signals STD1~SDTn in the conversion phase of the calibration mode. In Step S44, the offset comparison signals STD1~SDTn are stored as the offset reference signal SR1. In Step S45, the DC offset is calculated according to the offset reference signal SR1, and control signals SC1, SC2 are generated according to the DC offset. In some embodiments, the DC offset is the offset value of the offset reference signal SR1. In Step S46, in the normal mode, the input signal SI is received in the sampling phase. In Step S47, the signal SS1 and the signal SS2 are generated according to the input signal SI in the conversion phase of the normal mode. In some embodiments, Step S47 further includes adjusting the common-mode voltage of the signal SS1 and the signal SS2 according to the control signal SC1 and the control signal SC2. In Step S48, the signal SS1 and the signal SS2 are compared to generate n comparison signals SD1~SDn in the conversion phase of the normal mode. In Step S49, the comparison signals SD1~SDn are stored as the digital output signal SO1, and in the normal mode, the digital output signal SO1 is outputted.

After the analog-to-digital conversion method 40 obtains the DC offset, the absolute value of the common-mode voltage between the signal SS1 and the signal SS2 is reduced accordingly. Hence, when the DC offset of the common-mode voltage between the signal SS1 and the signal SS2 is reduced, the SNDR of the digital output signal SO1 is increased.

What is claimed is:

1. An analog-to-digital converter (ADC), configured to convert an input signal into a first digital output signal having n bits, comprising:
   a first capacitor module, configured to receive a first input signal at a sampling phase in a normal mode, and to generate a first sampling signal and a second sampling signal according to the first input signal in a conversion phase;
   a first control signal generation unit, configured to adjust the first sampling signal or the second sampling signal in the conversion phase;
   a first comparator, coupled to the first capacitor module, wherein in the normal mode, the first comparator is configured to compare the first sampling signal and the second sampling signal in the conversion phase to generate n first comparison signals; and
   a first register, configured to store the first comparison signals as the first digital output signal, and output the first digital output signal in the normal mode,
   wherein in a calibration mode,
      the first capacitor module is configured to receive a first offset test signal in the sampling phase, and generate a first offset test sampling signal and a second offset test sampling signal according to the first offset test signal in the conversion phase,
      the first comparator is configured to compare the first offset test sampling signal and the second offset test sampling signal in the conversion phase to generate n first offset comparison signals,
      the first register is configured to store the n first offset comparison signals as the first digital output signal, wherein, in the calibration mode, the first control signal generation unit is configured to calculate a first direct current (DC) offset of the ADC according to the first digital output signal and generate a first control signal according to the first DC offset, and the first DC offset comprises a common-mode voltage of the first offset test sampling signal and the second offset test sampling signal.

2. The ADC of claim 1, wherein the first control signal generation unit comprises:
a calculation circuit, configured to calculate the first DC offset according to the first offset reference signal; and
an adjustment circuit, configured to generate the first control signal according to the first DC offset, wherein the first DC offset corresponds to a configuration of the first capacitor module, wherein the first capacitor module further achieves the configuration according to the first control signal.

3. The ADC of claim 1, wherein the first capacitor module is configured to adjust the first sampling signal and maintain the second sampling signal according to the first control signal so as to decrease an absolute value of a common-mode voltage of the first sampling signal and the second sampling signal.

4. The ADC of claim 1, wherein the first capacitor module comprises:
a positive terminal capacitor array, having a first terminal and a second terminal, wherein, in the normal mode, the positive terminal capacitor array is configured to receive a first positive input signal of the first input signal from the first terminal of the positive terminal capacitor array in the sampling phase, and generate the first sampling signal to a positive input terminal of the first comparator from the first terminal of the positive terminal capacitor array in the conversion phase; and
a negative terminal capacitor array, having a first terminal and a second terminal, wherein, in the normal mode, the negative terminal capacitor array is configured to receive a first negative input signal of the first input signal from the first terminal of the negative terminal capacitor array in the sampling phase, and generate the second sampling signal to a negative input terminal of the first comparator from the first terminal of the negative terminal capacitor array in the conversion phase.

5. The ADC of claim 4, wherein the first capacitor module further comprises:
a first switching device, coupled to the second terminal of the positive terminal capacitor array, and configured to selectively electrically connect each capacitor of the positive terminal capacitor array to a first reference voltage or a second reference voltage; and
a second switching device, coupled to the second terminal of the plurality of negative terminal capacitor array, and configured to selectively electrically connect each capacitor of the negative terminal capacitor array to a third reference voltage or the second reference voltage,
wherein in the conversion phase of the normal mode, the first switching device is configured to control each capacitor of the positive terminal capacitor array to be selectively electrically connected to the first reference voltage or the second reference voltage according to the first control signal, so as to adjust the common-mode voltage of the first sampling signal and the second sampling signal.

6. The ADC of claim 5, wherein in the conversion phase of the normal mode, the first control signal generation unit further generates the first control signal according to the first digital output signal; and when the first comparator generates each of the first comparison signals, the first switching device is further configured to control each capacitor of the positive terminal capacitor array to be electrically connected to the first reference voltage or the second reference voltage according to the first control signal, and the second switching device is further configured to control each capacitor of the negative terminal capacitor array to electrically connected to the third reference voltage or the second reference voltage according to the first control signal.

7. The ADC of claim 5, wherein the first control signal generation unit further generates a second control signal according to the first digital output signal; and when the first comparator generates each of the first comparison signals, the first switching device is further configured to control each capacitor of the positive terminal capacitor array to be electrically connected to the first reference voltage or the second reference voltage according to the second control signal, and the first capacitor module further comprises:
a DC offset adjustment circuit, coupled to the first comparator and configured to adjust the common-mode voltage of the first sampling signal and the second sampling signal according to the first control signal.

8. The ADC of claim 1, wherein the ADC is further configured to convert the input signal into a second digital output signal having n bits, and the ADC further comprises:
a second capacitor module, wherein in the normal mode, the second capacitor module is configured to receive a second input signal in the sampling phase and generate a third sampling signal and a fourth sampling signal according to the second input signal in the conversion phase;
a second control signal generation unit, configured to adjust the third sampling signal or the fourth sampling signal in the conversion phase;
a second comparator, coupled to the second capacitor module, wherein in the normal mode, the second comparator configured to compare the third sampling signal and the fourth sampling signal to generate n second comparison signals in the conversion phase; and
a second register, configured to store the n second comparison signals as the second digital output signal, and output the second digital output signal in the normal mode.

9. The ADC of claim 8, wherein in the calibration mode,
the second capacitor module is configured to receive a second offset test signal in the sampling phase, and generate a third offset test sampling signal and a fourth offset test sampling signal according to the second offset test signal in the conversion phase,
the second comparator is configured to compare the third offset test sampling signal and the fourth offset test sampling signal to generate n second offset comparison signals in the conversion phase,
the second register is configured to store the n second offset comparison signals as the second digital output signal, and
wherein the second control signal generation unit is configured to calculate a second DC offset of the ADC according to the second digital output signal in the calibration mode, and generate a third control signal according to the second DC offset.

10. The ADC of claim 8, wherein the second DC offset comprises a common-mode voltage between the third offset test sampling signal and the fourth offset test sampling signal.

11. An analog-to-digital conversion method, configured to convert an input signal into a first digital output signal having n bits, comprising:
- receiving a first input signal in a sampling phase of a normal mode;
- generating a first sampling signal and a second sampling signal according to the first input signal in a conversion phase of the normal mode;
- comparing the first sampling signal and the second sampling signal to generate n first comparison signals in the conversion phase of the normal mode; and
- storing the n first comparison signals as the first digital output signal, and outputting the first digital output signal in the normal mode;
- wherein the step of generating the first sampling signal and the second sampling signal according to the first input signal in the conversion phase of the normal mode comprises:
- adjusting the first sampling signal or the second sampling signal,
- wherein the analog-to digital conversion method further comprises:
  - receiving a first offset test signal in the sampling phase of a calibration mode;
  - generating a first offset test sampling signal and a second offset test sampling signal according to the first offset test signal in the conversion phase of the calibration mode;
  - comparing the first offset test sampling signal and the second offset test sampling signal to generate n first offset comparison signals in the conversion phase of the calibration mode;
  - storing the n first offset comparison signals as the first digital output signal; and
  - calculating a first DC offset according to the first digital output signal in the calibration mode, and generating a first control signal according to the first DC offset,
  - wherein the first DC offset comprises a common-mode voltage of the first offset test input signal and the second offset test input signal.

12. The analog-to-digital conversion method of claim 11, wherein the step of adjusting the first sampling signal or the second sampling signal comprises:
- adjusting the first sampling signal and maintaining the second sampling signal according to the first control signal to decrease an absolute value of a common-mode voltage of the first sampling signal and the second sampling signal.

13. The analog-to-digital conversion method of claim 11, wherein the step of receiving the first input signal comprises:
- receiving a first positive input signal of the first input signal;
- generating the first sampling signal according to the first positive input signal;
- receiving a first negative input signal of the first input signal; and
- generating the second sampling signal according to the first negative input signal.

14. The analog-to-digital conversion method of claim 13, wherein the step of adjusting the first sampling signal and maintaining the second sampling signal according to the first control signal to decrease the absolute value of the common-mode voltage of the first sampling signal and the second sampling signal comprises:
- selectively electrically connecting the first sampling signal to a first reference voltage or a second reference voltage via a positive terminal capacitor array according to the first control signal.

15. The analog-to-digital conversion method of claim 14, wherein in the step of calculating the first DC offset according to the first digital output signal in the calibration mode and generating the first control signal according to the first DC offset, the first control signal is further generated according to the first digital output signal,
- wherein the step of adjusting the absolute value of the common-mode voltage of the first sampling signal and the second sampling signal according to the first control signal further comprises:
  - adjusting the common-mode voltage of the first sampling signal and the second sampling signal according to the first control signal adjust the second sampling signal, comprising:
    - selectively electrically connecting the second sampling signal to a third reference voltage or the second reference voltage via a negative terminal capacitor array according to the first control signal.

16. The analog-to-digital conversion method of claim 14, further comprising:
- generating a second control signal according to first digital output signal; and
- when each of the first comparison signals is generated, selectively electrically connecting the first sampling signal to the first reference voltage or the second reference voltage via the positive terminal capacitor array according to the second control signal.

17. The analog-to-digital conversion method of claim 11, wherein the analog-to-digital conversion method is further configured to convert the input signal into a second digital output signal having n bits and further comprises:
- receiving a second input signal in the sampling phase of the normal mode;
- generating a third sampling signal and a fourth sampling signal according to the second input signal in the conversion phase of the normal mode;
- comparing the third sampling signal and the fourth sampling signal to generate n second comparison signals in the conversion phase of the normal mode; and
- storing the n second comparison signals as the second digital output signal, and outputting the second digital output signal in the normal mode,
- wherein the step of generating the third sampling signal and the fourth sampling signal according to the second input signal in the conversion phase of the normal mode comprises:
  - adjusting the third sampling signal or the fourth sampling signal.

18. The analog-to-digital conversion method of claim 17, wherein
- receiving a second offset test signal in the sampling phase of the calibration mode;
- generating a third offset test sampling signal and a fourth offset test sampling signal according to the second offset test signal in the conversion phase of the calibration mode;
- comparing the third offset test sampling signal and the fourth offset test sampling signal to generate n second offset comparison signals in the conversion phase of the calibration mode;
- storing the n second offset comparison signals as the second digital output signal; and calculating a second DC offset according to the second digital output signal in the calibration mode, and generating a third control signal according to the second DC offset,
wherein the second DC offset comprises a common-mode voltage of the third offset test input signal and the fourth offset test input signal.

* * * * *